(12) United States Patent
Xia et al.

(10) Patent No.: US 10,492,270 B2
(45) Date of Patent: Nov. 26, 2019

(54) LIGHTING DEVICE

(71) Applicant: SHENZHEN ROYOLE TECHNOLOGIES CO. LTD., Shenzhen, Guangdong (CN)

(72) Inventors: Xinyuan Xia, Guangdong (CN);
Youxiang Ding, Guangdong (CN);
Songling Yang, Guangdong (CN);
Zhanchao Liu, Guangdong (CN);
Jinhui Yang, Guangdong (CN); Xin Chen, Guangdong (CN); Ji Wang, Guangdong (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 109 days.

(21) Appl. No.: 15/745,016

(22) PCT Filed: Dec. 31, 2015

(86) PCT No.: PCT/CN2015/100179
§ 371 (c)(1),
(2) Date: Jan. 15, 2018

(87) PCT Pub. No.: WO2017/113323
PCT Pub. Date: Jul. 6, 2017

(65) Prior Publication Data
US 2018/0213627 A1    Jul. 26, 2018

(51) Int. Cl.
*H05B 37/02*    (2006.01)
*F21S 4/20*    (2016.01)
(Continued)

(52) U.S. Cl.
CPC ........... *H05B 37/02* (2013.01); *F21S 4/20* (2016.01); *F21S 6/003* (2013.01); *F21S 9/02* (2013.01);
(Continued)

(58) Field of Classification Search
CPC ............ H05B 37/02; H05B 33/0824; H05B 33/0845; H05B 33/0863; F21S 4/20;
(Continued)

(56) References Cited

U.S. PATENT DOCUMENTS

| 4,556,824 A | 12/1985 | Cheng |
| 2013/0271966 A1 | 10/2013 | Doble |
| 2015/0373806 A1 | 12/2015 | Vissenberg et al. |

FOREIGN PATENT DOCUMENTS

| CN | 101324309 A | 12/2008 |
| CN | 201170463 Y | 12/2008 |

(Continued)

OTHER PUBLICATIONS

International search report issued in corresponding international application No. PCT/CN2015/100179 dated Sep. 7, 2016.

*Primary Examiner* — Robert L Deberadinis
(74) *Attorney, Agent, or Firm* — Hauptman Ham, LLP (57) ABSTRACT

A lighting device includes a pedestal, a supporting column, a flexible touch panel, and a light source assembly. One end of the supporting column is connected to the pedestal, and the other end of the supporting column is connected to the light source assembly. The flexible touch panel is attached on an outside surface of the supporting column, the flexible touch panel is electrically connected with the light source assembly, and the flexible touch panel is operable to sense a touch action to control a luminous state of the light source assembly. The brightness, color temperature and the like of the luminous state of the light source assembly may be
(Continued)

controlled by touching the flexible touch panel. The flexible touch panel is set on the supporting column for a user to touch and operate, which improves the user's operating experience.

15 Claims, 5 Drawing Sheets (51) Int. Cl.
    *F21S 6/00*     (2006.01)
    *F21S 9/02*     (2006.01)
    *F21V 23/04*     (2006.01)
    *H03K 17/96*     (2006.01)
    *H05B 33/08*     (2006.01)
    *F21V 21/26*     (2006.01)
    *F21V 21/06*     (2006.01)
    *F21Y 103/10*     (2016.01)
    *F21Y 115/10*     (2016.01)

(52) U.S. Cl.
    CPC .......... *F21V 21/26* (2013.01); *F21V 23/0485* (2013.01); *H03K 17/96* (2013.01); *H05B 33/0824* (2013.01); *H05B 33/0845* (2013.01); *H05B 33/0863* (2013.01); *F21V 21/06* (2013.01); *F21Y 2103/10* (2016.08); *F21Y 2115/10* (2016.08); *H03K 2217/96015* (2013.01)

(58) Field of Classification Search
    CPC ........ F21S 9/02; F21V 21/26; F21V 23/0485; F21V 21/06; H03K 17/96; H03K 2217/96015; F21Y 2103/10; F21Y 2115/10
    See application file for complete search history.

(56) References Cited

FOREIGN PATENT DOCUMENTS

| | | |
|---|---|---|
| CN | 102612212 A | 7/2012 |
| CN | 202385348 U | 8/2012 |
| CN | 202719464 U | 2/2013 |
| CN | 203363934 U | 12/2013 |
| CN | 105135267 A | 12/2015 |
| DE | 102011121965 A1 | 6/2003 |
| DE | 20304705 U1 | 7/2003 |
| JP | H04233104 A | 8/1992 |
| JP | 2012238464 A | 12/2012 |
| JP | 2014186931 A | 10/2014 |
| JP | 2015187851 A | 10/2015 |

LIGHTING DEVICE

RELATED APPLICATIONS

The present application is a National Phase of International Application Number PCT/CN2015/100179, filed Dec. 31, 2015.

TECHNICAL FIELD

The application relates to the field of a lighting apparatus, more particularly relates to a lighting device.

BACKGROUND

A table lamp of the related art generally changes the light brightness by a rotary knob, the rotary knob requires a user to find a position of the rotary knob and then turn the rotary knob by fingers. However, the rotary knob sometimes requires much force to turn it, thereby causing adjusting the brightness of the lighting device is difficult, and affecting the user's experience.

SUMMARY

The technical problem of the present invention to be solved is to provide a lighting device for dimming conveniently.

In order to solve the above technical problem, an embodiment of the present invention provides a lighting device, including a pedestal, a supporting column, a flexible touch panel, and a light source assembly;
wherein one end of the supporting column is connected to the pedestal, and the other end of the supporting column is connected to the light source assembly;
the flexible touch panel is attached on an outside surface of the supporting column,
the flexible touch panel is electrically connected with the light source assembly, and
the flexible touch panel is operable to sense a touch action to control a lighting state of the light source assembly.

The lighting device is provided by the present invention, the brightness, the color temperature and other functions of the lighting state of the light source assembly may be controlled by touching the flexible touch panel. A user touches the flexible touch panel without using much force to facilitate dimming. The flexible touch panel is set on the supporting column, thus it may be convenient for a user to touch and operate, and improve the user's operating experience.

BRIEF DESCRIPTION OF THE DRAWINGS

In order to describe the embodiments of the present application or the technical solutions in prior art more clearly, accompanying drawings required for describing the embodiments or the prior art will be briefly introduces. Apparently, the accompanying drawings in the following description are merely the embodiments of the present application, and other drawings may be obtained by those skilled in the art according to these accompanying drawings without paying any creative labor.

DETAILED DESCRIPTION

The technical solutions in the embodiments of the present invention are clearly and completely described below with reference to the accompanying drawings in the embodiments of the present invention.

Figure 1:
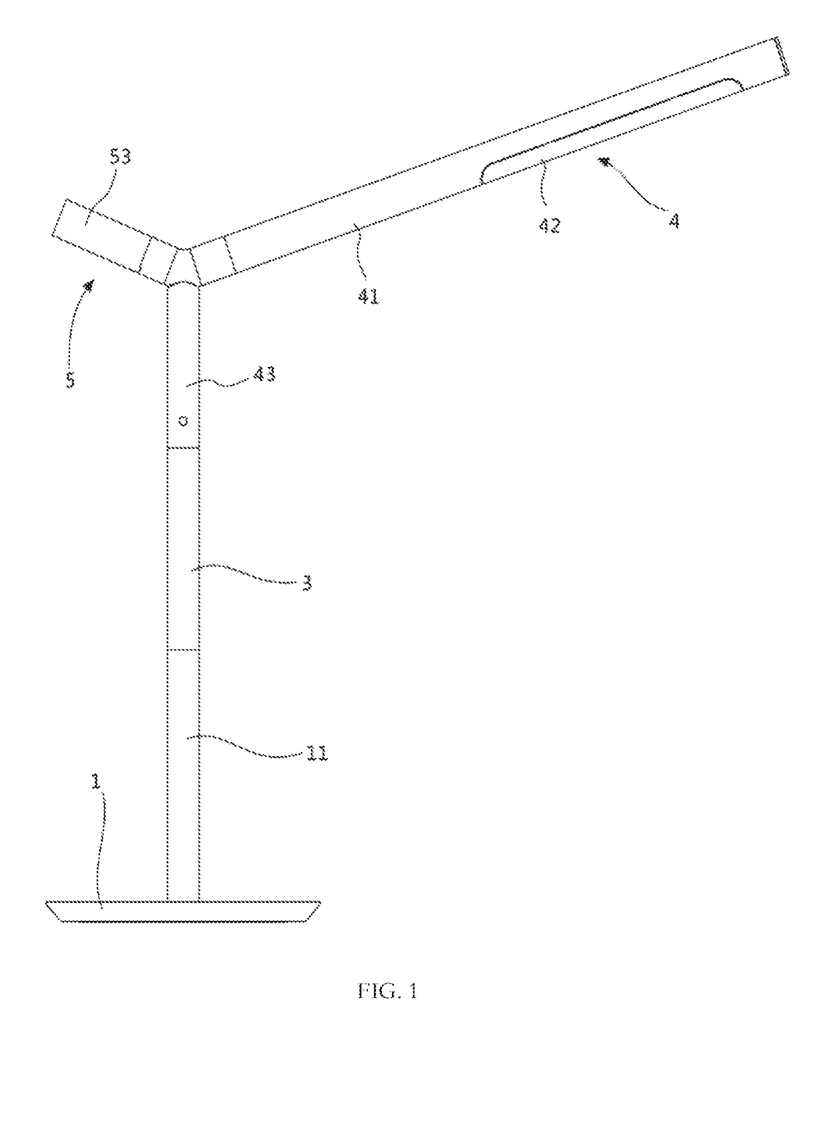
FIG. 1 is a structural schematic view of alighting device provided by an exemplary embodiment of the present application.
Figure 2:
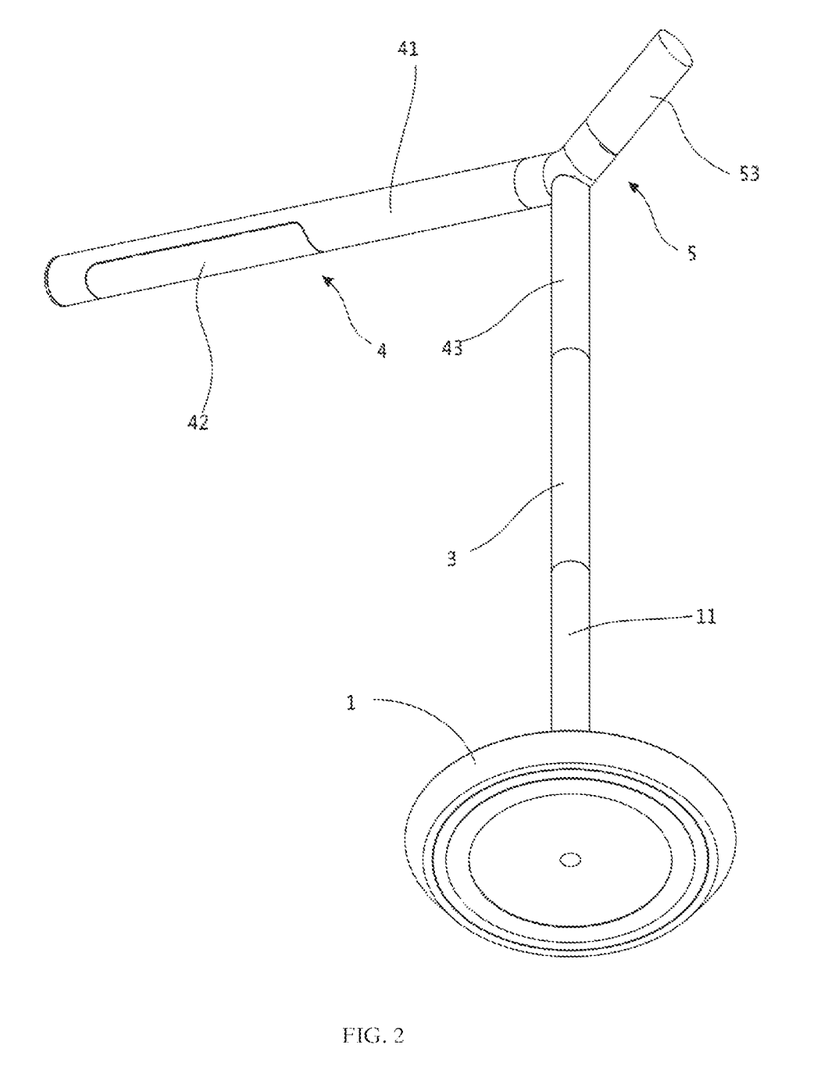
FIG. 2 is a structural schematic view of the lighting device of FIG. 1, but viewed from another aspect.
Figure 3:
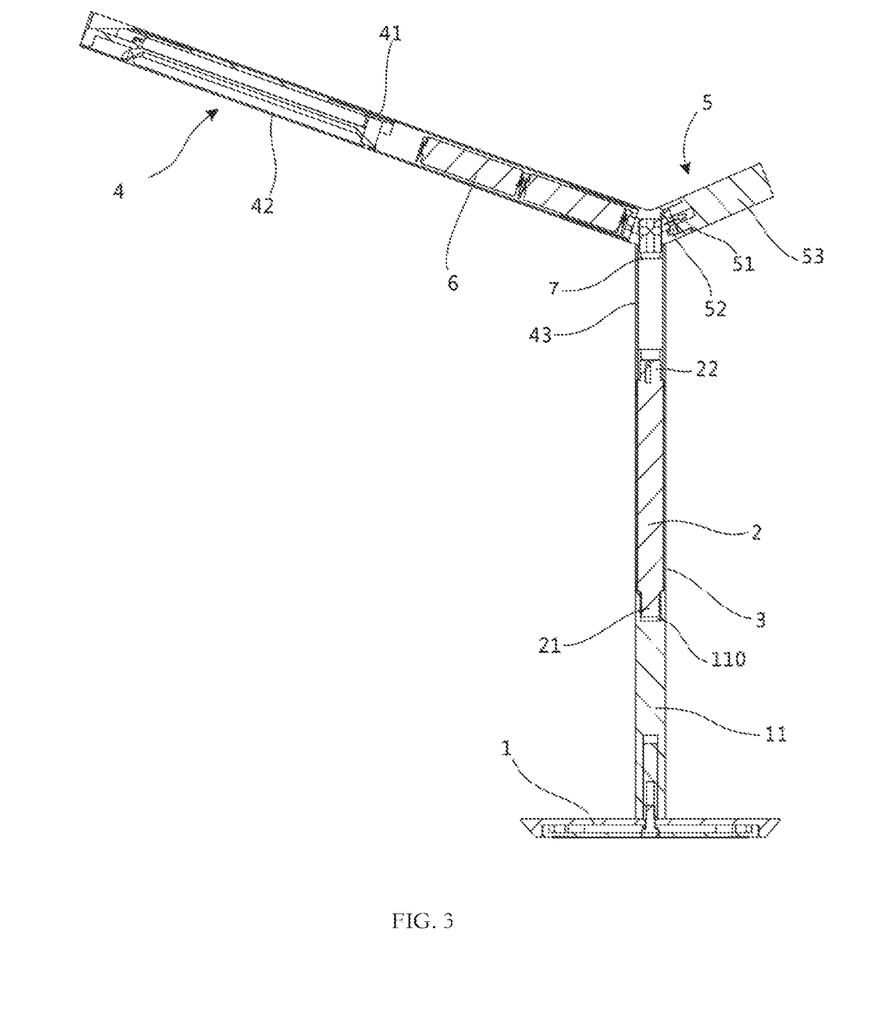
FIG. 3 is a cross-sectional, structural schematic view of the lighting device of FIG. 1.

As shown in FIGS. 1 to 3, a lighting device is provided by an exemplary embodiment of the present application. The lighting device may be preferably a table lamp, which includes a pedestal 1, a supporting column 2, a flexible touch panel 3 and a light source assembly 4. The flexible touch panel 3 is set on the supporting column 2, and is electrically connected with the light source assembly 4, thus to realize the control of the light source assembly 4.

Figure 4:
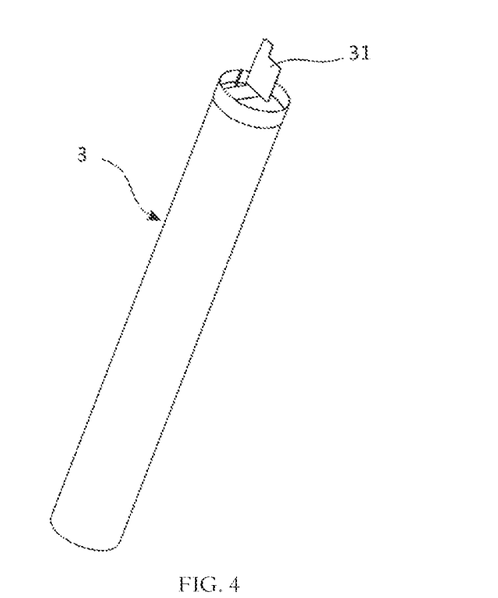
FIG. 4 is a structural schematic view of a flexible touch panel of the lighting device of FIG. 1.

One end of the supporting column 2 is connected to the pedestal 1, and the other end of the supporting column 2 is connected to the light source assembly 4. The support of the light source assembly 4 may be achieved by using the supporting column 2. As shown in FIG. 3 and FIG. 4, the flexible touch panel 3 is attached and fixed on an outside surface of the supporting column 2, the flexible touch panel 3 is electrically connected with the light source assembly 4, and the flexible touch panel 3 is operable to sense a touch action to control a lighting state of the light source module 4. A user may touch the flexible touch panel 3 to control the lighting state of the light source assembly 4, for example, brightness, color temperature, or the like. The user may slightly touch the flexible touch panel 3 without using much force, thus to facilitate dimming. The flexible touch panel 3 is set on the supporting column 2, so it may be convenient for a user to touch and operate, and may improve the user's operating experience. A control of the light source assembly 4 may be realized by sliding the flexible touch panel 3 up and down or sliding the flexible touch panel 3 left and right for the ease of use.

In an embodiment, the flexible touch panel 3 may be slid up and down to control the brightness of the light source assembly 4, and the flexible touch panel 3 may also be slid left and right to control the color temperature of the light source assembly 4. Of course, in other embodiments, the color temperature of the light source assembly 4 may be controlled by sliding on the flexible touch panel 3 toward up and down, and the brightness of the light source assembly 4 may be controlled by sliding on the flexible touch panel 3 toward left or right. Alternatively, other gestures may operate the flexible touch panel 3 to adjust other functions of the light source assembly 4.

The flexible touch panel 3 surrounds the supporting column 2, therefore the flexible touch panel 3 may be wound to form an annular shape. A periphery of the supporting column 2 is provided with the flexible touch panel 3. The user may touch the flexible touch panel 3 anywhere around the lighting device, therefore, the lighting device is more convenient to use, and further increases the operating experience to the user.

Both of the flexible touch panel 3 and the supporting column 2 may be made from transparent material, so that a unique visual effect is formed to attract attention from the user, and it is convenient for the user to determine a position of the flexible touch panel 3 to control the light source assembly 4. The supporting column 2 may be made from transparent acrylic or Polycarbonate (PC). Of course, in other embodiments, the supporting column 2 may also be made from other transparent materials.

As shown in FIG. 3, a mounting column 11 is set on the pedestal 1, and the supporting column 2 is coaxially set with the mounting column 11. The supporting column 2 is detachably and fixedly connected to the mounting column 11. The mounting column 11 may further support the lighting assembly to a certain height for illumination, and facilitate an assembly connection between the supporting column 2 and the pedestal 1.

Figure 5:
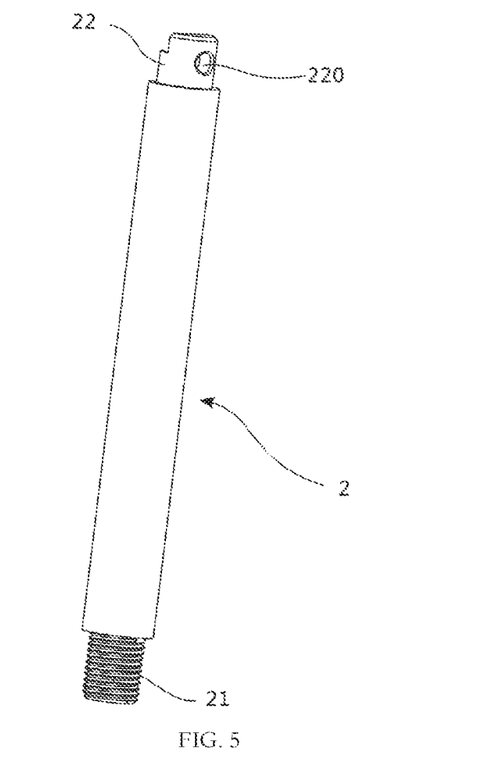
FIG. 5 is a structural schematic view of a supporting column of the lighting device of FIG. 3.
Figure 6:
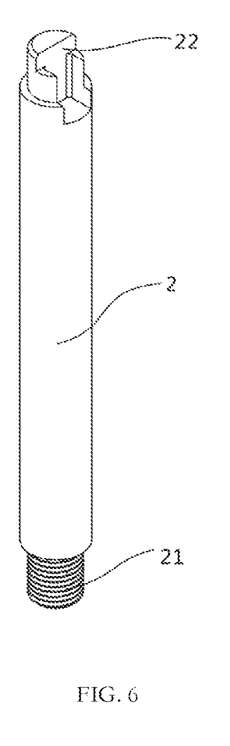
FIG. 6 is a structural schematic view of the supporting column of the lighting device of FIG. 5, but viewed from another aspect.

As shown in FIG. 3, FIG. 5 and FIG. 6, one end of the supporting column 2 is provided with a threaded column 21. An end surface of the mounting column 11 defines a threaded hole 110, and the threaded column 21 is screwed into the threaded hole 110, thus to facilitate the assembly connection between the supporting column 2 and the mounting column 11. The threaded column 21 is set on the supporting column 2. After assembly, the threaded column 21 is located within the threaded hole 110 of the mounting column 11, therefore, the threaded column 21 is invisible from outside, and the lighting device may have a good appearance. Of course, the supporting column 2 and the mounting column 11 may also be fixedly connected by other detachable structures, such as a buckle structure.

In the embodiment, the supporting column 2 is fixedly connected to the pedestal 1 via the mounting column 11. Of course, in other embodiments, the supporting column 2 may be directly connected to the pedestal 1. The supporting column 2 and the pedestal 1 may also be rotatably connected, so that the supporting column 2 may drive the light source assembly 4 to rotate relative to the pedestal 1 to facilitate an adjustment of the illumination angle.

Preferably, the supporting column 2 may be substantially cylindrical, and the flexible touch panel 3 is wound to form an annular shape, thus to facilitate the bonding connection between the flexible touch panel 3 and an outside surface of the supporting column 2. At the same time, the outside surface of the flexible touch panel 3 may be substantially a circular arc shape, therefore the flexible touch panel 3 may be convenient for the user to slide and touch left and right in a circumferential direction of the flexible touch panel 3, and thereby improve the user's operating experience. Correspondingly, the mounting columns 11 may be also substantially cylindrical, so that the appearance of the lighting device is more uniform and beautiful. Here, in other embodiments, the supporting column 2 may have other shapes, for example, a square prism, a polygonal prism, an elliptic cylinder, or the like.

The supporting column 2 may be substantially a solid column, which improves a structural strength of the supporting column 2 and further improves the structural strength of the whole lighting device. Of course, in other embodiments, the supporting column 2 may also be substantially a hollow column.

An axial direction of the supporting column 2 is vertical, which is perpendicular to the pedestal 1, so that the whole lighting device may maintain a good balance. Here, in other embodiments, the supporting column 2 may also be inclined relative to the pedestal 1 as needed.

An axial length of the flexible touch panel 3 is larger than a diameter of the flexible touch panel 3 to form a long strip, so that the axial size of the flexible touch panel 3 is large enough to better attract attention from the user, and it is convenient for the user to control the flexible touch panel 3.

The axial length of the flexible touch panel 3 may be smaller than the axial length of the supporting column 2. Both ends of the flexible touch panel 3 are substantially coplanar with both ends of a middle portion of the supporting column 2 located between the threaded column 21 and a protrusion 22. That is, the axial length of an outside surface of the flexible touch panel 3 is substantially equal to the axial length of an outside surface of the supporting column 2, to increase the size of the flexible touch panel 3 on the whole lighting device, thereby the flexible touch panel 3 may be also convenient for the user to touch and operate. Of course, the flexible touch panel 3 may also extend beyond the both ends of the middle portion of the supporting column 2 to cover the mounting column 11. Alternatively, the length of the flexible touch panel 3 may also be less than the length of the middle portion of the supporting column 2 located between the threaded column 21 and the protrusion 22.

The outside surface of the flexible touch panel 3 is substantially coplanar with the outside surface of the mounting column 11. When the user slides the flexible touch panel 3 onto the mounting column 11, the user's operation feeling is improved. At the same time, the appearance of the lighting device may be simple and beautiful.

As shown in FIG. 1 to FIG. 3, the light source assembly 4 includes a lamp housing 41 and an LED light 42. The LED light 42 is mounted in the lamp housing 41. Energy consumption may be reduced by using the LED light 42. Preferably, the lamp housing 41 may be substantially columnar, and one end of the lamp housing 41 is connected to the supporting column 2. The LED light 42 may be substantially a long strip axially set along the lamp housing 41. The LED light 42 may be a light belt formed by axially arranging a plurality of LEDs along the lamp housing 41.

As shown in FIG. 3, FIG. 5, and FIG. 6, the light source assembly 4 further includes a mounting cylinder 43 fixed at one end of the lamp housing 41, and the mounting cylinder 43 is connected to the supporting column 2. The supporting column 2 and the light source assembly 4 may be fixedly connected by matching the mounting cylinder 43 with the supporting column 2. Preferably, the supporting column 2 is set coaxially with the mounting cylinder 43.

The supporting column 2 includes a protrusion 22 inserted into the mounting cylinder 43. A receiving cavity is formed between the protrusion 22 and an inner wall of the mounting cylinder 43 surrounding the protrusion 22. The flexible touch panel 3 is electrically connected with a flexible circuit board 31. The flexible circuit board 31 is electrically connected with the light source assembly 4. The flexible circuit board 31 is located in the receiving cavity. The support column 2 and the mounting cylinder 43 may be assembled conveniently by using the protrusion 22, and the flexible circuit board 31 is set conveniently in the formed receiving cavity, thus to facilitate an electrical connection between the flexible touch panel 3 and the light source assembly 4.

The protrusion 22 is a semi-columnar shape provided at the other end of the supporting column 2. The protrusion 22 extends into the mounting cylinder 43, and is fixedly connected to the mounting cylinder 43, thus to realize the connection between the supporting column 2 and the light source assembly 4.

The protrusion 22 defines a connecting hole 220. The axial direction of the connecting hole 220 is perpendicular to the axial direction of the supporting column 2. A position on the wall of the mounting cylinder 43 corresponding to the connecting hole 220 defines a through hole (not shown in the drawings). The light source assembly 4 further includes a fixing member (not shown in the drawings). The fixing member passes through the through hole and the connecting hole 220, so that the mounting cylinder 43 and the protrusion 22 are fixed together. The fixing member may be a screw or a pin. After the protrusion 22 is installed in the mounting cylinder 43, the fixing member may be passed through the through hole and the connecting hole 220 from an outside of the mounting cylinder 43 to achieve the assembly connection between the supporting column 2 and the mounting cylinder 43. Here, in other embodiments, the protrusion 22 may define a connecting hole 220. An axial direction of the connecting hole 220 may be perpendicular to the axial direction of the supporting column 2. The fixing member is fixed on an inner wall of the mounting cylinder 43, and the fixing member is latched in the connecting hole 220. When the protrusion 22 is inserted into the mounting cylinder 43, the fixing member is latched in the connecting hole 220, thus to fix the supporting column 2 and the mounting cylinder 43 together.

As shown in FIG. 4, because the protrusion 22 is substantially semi-columnar, a receiving cavity may be formed between the protrusion 22 and the inner wall of the mounting cylinder 43 surrounding the protrusion 22. The flexible circuit board 31 electrically connected with the flexible touch panel 3 is located in the receiving cavity. The outside surface of the flexible touch panel 3 is substantially coplanar with an outside surface of the mounting cylinder 43, thereby further improving the user's operating feel.

As shown in FIG. 3, the lighting device further includes a switch assembly 5 configured to switch the light source assembly 4. The switch assembly 5 is set on the light source assembly 4. The switch assembly 5 may be configured to turn on or off a power of the light source assembly 4. Here, in other embodiments, the switch assembly 5 may also be set on the pedestal 1.

The switch assembly 5 and the light source assembly 4 are respectively set on two opposite sides of the supporting column 2 to ensure the whole balance of the lighting device. In this embodiment, the switch assembly 5, the light source assembly 4, and the supporting column 2 are substantially connected to form a Y shape.

The switch assembly 5 includes an LED night light 51, a circuit board 52 and a rotary button 53 rotatably connected to the lamp housing 41. The change of the brightness of the LED night light 51 is opposite to the change of the brightness of the LED light 42. When the LED light 42 becomes bright, the LED night light 51 dims, and vice versa. The LED night light 51 is electrically connected with the flexible touch panel 3 to achieve a simultaneous adjustment of the LED night light 51 and the LED light 42.

The rotary button 53 is electrically connected with the circuit board 52. The circuit board 52 is configured to generate a switch signal according to a rotation of the rotary button 53. The LED night light 51 is set on the circuit board 52 and received in the rotary button 53, and the LED night light 51 is located on a central axis of the rotary button 53. The LED night light 51 is electrically connected with the flexible touch panel 3. Turning the rotary button 53, the light source assembly 4 may be turned on or off, and at the same time the LED night light 51 may be also turned on or off.

The rotary button 53 is made from transparent material, and light emitted by the LED night light 51 is passed through the rotating button 53. The LED night light 51 may also be used for illumination in a manner that the light of LED night light 51 passes through the rotary button 53. The switch assembly 5 may be not only configured to perform on-off control, but also to light, thereby being easy to use. Here, in other embodiments, the switch assembly 5 may further adopt a push switch, a toggle switch or other types of switches.

The LED night light 51 is electrically connected with the flexible touch panel 3, and the LED night light 51 may also be controlled by the flexible touch panel 3. In this embodiment, the flexible touch panel 3 has two control modes: sliding up and down and sliding left and right. Sliding up and down is to adjust the brightness of the LED light 42 and LED night light 51. For example, when sliding up, the brightness of the LED light 42 may increase and the brightness of the LED night light 51 may decrease, when sliding down, the brightness of the LED light 42 may decrease, and the brightness of the LED night light 51 may increase. The change of the brightness of the LED light 42 is opposite to the change of the brightness of the LED night light 51. Sliding left and right is to adjust the color temperature of the LED light 42, for example, increasing the color temperature by sliding left and reducing the color temperature by sliding right.

Furthermore, as shown in FIG. 3, the lighting device further includes a battery 6. The battery 6 is electrically connected with the flexible touch panel 3 and the light source assembly 4. The battery 6 may be configured to power the light source assembly 4, thereby an external power may be not required and the lighting device may be convenient to move.

The mounting cylinder 43 further has a controller 7 therein, which is electrically connected with the flexible touch panel 3, the battery 6, the light source assembly 4 and the switch assembly 5. The controller 7 receives a touch signal sensed by the flexible touch panel 3 and then converts the touch signal into a control signal, thus to control the LED light 42 of the light source assembly 4 and the LED night light 51 of the switch assembly 5. The controller 7 also receives the switch signal from the circuit board 52 to control the lighting device to be turned on and off.

In this embodiment, the battery 6 and the controller 7 are located on the same side of the flexible touch panel 3, wherein the battery 6 is set in the light source assembly 4. More specifically, the lamp housing 41 of the light source assembly 4 is substantially cylindrical, and the battery 6 is set on an end of the lamp housing 41 adjacent to the supporting column 2, to ensure the balance of the whole lighting device. Here, in other embodiments, the battery 6 and the controller 7 may also be located at two opposite sides of the flexible touch panel 3, wherein the battery 6 is set in the supporting column 2, or the battery 6 is set in the pedestal 1. When the battery 6 is located under the flexible touch panel 3, the flexible touch panel 3 may be configured as a conductive path to electrically connect the battery 6 and the controller 7 in the mounting cylinder 43, so that an external wire may be not required and an internal structure of the lighting device may be more compact.

The above embodiments do not limit the protection scope of the technical solutions. Any modification, equivalent replacement and improvement made in the spirit and principle of the above embodiments should be included in the protection scope of the technical solution.

What is claimed is:
1. A lighting device, comprising:
a pedestal;
a supporting column;
a flexible touch panel; and
a light source assembly;

wherein one end of the supporting column is connected to the pedestal, and another end of the supporting column is connected to the light source assembly; and wherein the flexible touch panel is attached on an outside surface of the supporting column, the flexible touch panel is electrically connected with the light source assembly, and the flexible touch panel is operable to sense a touch action to control a lighting state of the light source assembly.

2. The lighting device of the claim 1, wherein the supporting column is surrounded by the flexible touch panel.

3. The lighting device of the claim 1, wherein both of the flexible touch panel and the supporting column are made from transparent material.

4. The lighting device of the claim 1, wherein a mounting column is disposed on the pedestal, the supporting column is coaxially set with the mounting column, and the supporting column is detachably connected to the mounting column.

5. The lighting device of claim 1, wherein the light source assembly comprises a lamp house and a light-emitting diode (LED) light, and the LED light is mounted in the lamp house.

6. The lighting device of the claim 5, wherein the light source assembly further comprises a mounting cylinder fixed at one end of the lamp housing, and the mounting cylinder is connected to the supporting column.

7. The lighting device of the claim 6, wherein the supporting column comprises a protrusion inserted into the mounting cylinder, a receiving cavity is formed between the protrusion and an inner wall of the mounting cylinder surrounding the protrusion, the flexible touch panel is electrically connected with a flexible circuit board, the flexible circuit board is electrically connected with the light source assembly, and the flexible circuit board is located in the receiving cavity.

8. The lighting device of the claim 6, wherein an outside surface of the flexible touch panel is substantially coplanar with an outside surface of the mounting cylinder.

9. The lighting device of the claim 5, wherein the lighting device further comprises a switch assembly operable to switch the light source assembly, and the switch assembly is mounted on the light source assembly.

10. The lighting device of the claim 9, wherein the switch assembly and the lamp housing are respectively located at two opposite sides of the supporting column.

11. The lighting device of the claim 9, wherein the switch assembly comprises an LED night light, change of the brightness of the LED night light is opposite to change of the brightness of the LED light.

12. The lighting device of the claim 11, wherein the switch assembly further comprises a rotary button rotatably connected to the lamp housing, the LED night light is received in the rotary button, and light emitted by the LED night light passes through the rotary button.

13. The lighting device of the claim 5, wherein the lighting device further comprises a controller and a battery, and the controller and the battery are both electrically connected with the flexible touch panel and the light source assembly.

14. The lighting device of the claim 13, wherein the battery and the controller are mounted on the same side of the flexible touch panel, and the battery is received in the lamp housing.

15. The lighting device of claim 13, wherein the battery and the controller are respectively mounted on two opposite sides of the flexible touch panel, and the flexible touch panel is a conductive path electrically interconnecting the battery and the controller.

* * * * *